(12) United States Patent
Miyajima et al.

(10) Patent No.: US 7,599,414 B2
(45) Date of Patent: Oct. 6, 2009

(54) LASER DEVICE

(75) Inventors: Hirofumi Miyajima, Hamamatsu (JP);
Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 170 days.

(21) Appl. No.: 11/628,414

(22) PCT Filed: Jul. 8, 2005

(86) PCT No.: PCT/JP2005/012682

§ 371 (c)(1),
(2), (4) Date: Dec. 5, 2006

(87) PCT Pub. No.: WO2006/016459

PCT Pub. Date: Feb. 16, 2006

(65) Prior Publication Data

US 2008/0095204 A1    Apr. 24, 2008

(30) Foreign Application Priority Data

Aug. 12, 2004    (JP) .............................. 2004-235527

(51) Int. Cl.
*H01S 3/04* (2006.01)

(52) U.S. Cl. .................. 372/34; 372/35; 372/36; 257/712; 257/714; 257/715; 257/716; 257/721

(58) Field of Classification Search .................. 372/35, 372/34, 36; 257/712, 714–716, 721
See application file for complete search history.

(56) References Cited

FOREIGN PATENT DOCUMENTS

| JP | 08-116138 | 5/1996 |
|---|---|---|
| JP | 10-209531 | 8/1998 |
| JP | 2001-111176 | 4/2001 |
| JP | 2003-324231 | 11/2003 |

*Primary Examiner*—Minsun Harvey
*Assistant Examiner*—Tod T Van Roy
(74) *Attorney, Agent, or Firm*—Drinker Biddle & Reath LLP

(57) ABSTRACT

A laser apparatus (100) has a semiconductor laser device (12a to 12c), coolant jetting means (24), and a heatsink (18a to 18c). The semiconductor laser device has a light output surface (50) for emitting laser light. The coolant jetting means has a coolant chamber (53) for accommodating a coolant, an inflow port (54) communicating with the coolant chamber, and a jet port (25) opposing the light output surface of the laser device. The heatsink has a laser mount surface (36) for mounting the semiconductor laser device, and a flow path (68a to 68c) where the coolant (56) jetted from the jet port flows in. When the coolant chamber is fed with the coolant, the jet port jets the coolant onto the light output surface of the semiconductor laser device. Since the light output surface is directly cooled by a jet flow of the coolant, cooling efficiency is excellent.

14 Claims, 15 Drawing Sheets

*Fig.5*
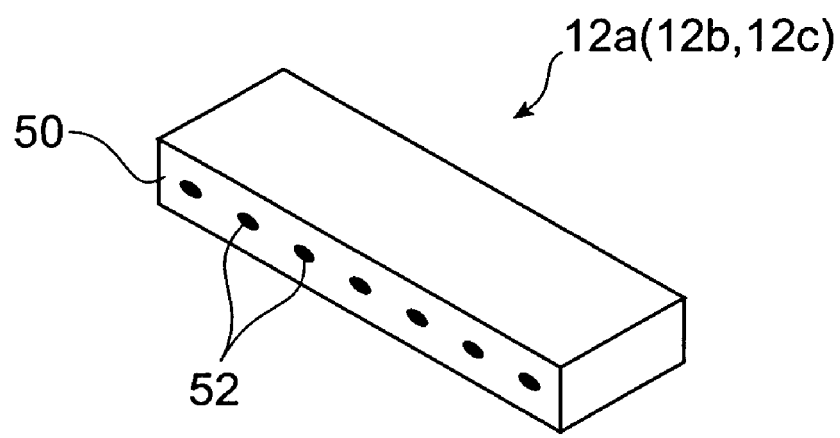
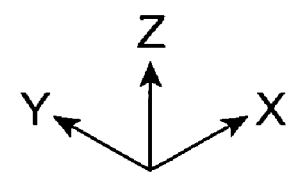

LASER DEVICE

TECHNICAL FIELD

The present invention relates to a laser apparatus which emits laser light.

BACKGROUND ART

High-output laser apparatus utilizing laser diode arrays have been known. These laser apparatus require a structure for cooling the laser diode arrays. For example, Japanese Patent Application Laid-Open No. HEI 10-209531 discloses a technique which attaches a heatsink to the bottom face of a laser diode array and causes a coolant to flow through the heatsink, thereby cooling laser diodes.

DISCLOSURE OF THE INVENTION

Semiconductor laser devices such as laser diode arrays attain a high temperature in particular about their light output surface. In Japanese Patent Application Laid-Open No. HEI 10-209531, however, the laser diode array is arranged such that its bottom face is in contact with the cooling surface of the heatsink, and thus is cooled from the bottom face. This makes it difficult to efficiently cool the front end face of the laser diode array, i.e., the light output surface. When the light output surface is cooled insufficiently, the temporal deterioration of light output in semiconductor laser devices may be accelerated, thus causing the fear of lowering their longterm reliability.

Therefore, it is an object of the present invention to provide a laser apparatus which can efficiently cool the light output surface of a semiconductor laser device.

The laser apparatus in accordance with the present invention has a semiconductor laser device, coolant jetting means, and a heatsink. The semiconductor laser device has a light output surface for emitting laser light. The coolant jetting means has a coolant chamber for accommodating the coolant, and a jet port communicating with the coolant chamber and opposing the light output surface of the laser device. The heatsink has a laser mount surface for mounting the semiconductor laser device and a first coolant flow path where the coolant jetted from the jet port flows in.

Supplying the coolant chamber with the coolant allows the latter to jet onto the light output surface of the semiconductor laser device. Since the light output surface is directly cooled by the jet flow of the coolant, the cooling efficiency is excellent.

The coolant jetting means may be a plate which has a main face opposing the light output surface and transmits the laser light therethrough. This plate has a hollow part as the above-mentioned coolant chamber, whereas the jet port is provided on the above-mentioned main face opposing the light output surface. Using such coolant jetting means allows the coolant to jet onto the light output surface without obstructing the emission of laser light.

The coolant jetting means may be a collimator lens having a first lens surface opposing the light output surface and a second lens surface arranged farther from the light output surface than is the first lens surface. This collimator lens has a hollow part as the above-mentioned coolant chamber, whereas the jet port is provided on the first lens surface. Using such coolant jetting means allows the coolant to jet onto the light output surface without obstructing the emission of laser light. On the other hand, it is unnecessary to prepare a collimator lens separately from the laser apparatus and align it with the laser apparatus.

When the semiconductor laser device has a plurality of light emission spots arranged along one direction on the light output surface, the coolant jetting means may have a plurality of jet ports aligned along the direction along which the light emission spots are arranged. Such a structure efficiently cools the semiconductor laser device about the light emission spots.

When the semiconductor laser device has a plurality of light emission spots arranged along one direction on the light output surface, the jet port may be a slit elongated along the direction along which the light emission spots are arranged. Using the jet port having such a form efficiently cools the semiconductor laser device about the light emission spots.

The laser mount surface may have a coolant suction port communicating with the first coolant flow path. The coolant colliding with the light output surface after jetting from the jet port flows into the first coolant flow path through the suction port.

The laser apparatus may further comprise a coolant exit port communicating with the first coolant flow path. The coolant flowing through the first coolant flow path is discharged through the coolant exit port.

The laser apparatus may further comprise a support member and a pump. The support member is mounted with the semiconductor laser device and the heatsink, while having a second coolant flow path. The pump is connected between the first and second coolant flow paths, takes in the coolant from the first coolant flow path, and discharges the coolant to the second coolant flow path. The coolant jetting means may further have an inflow port communicating with the coolant chamber. The coolant jetting means is attached to the support member in a state where the inflow port communicates with the second coolant flow path. Such a structure allows the coolant to circulate between the laser apparatus and the pump.

The semiconductor laser device may have a light emission spot arranged on the light output surface. The jet port may be arranged such as to jet the coolant near the light emission spot in the light output surface of the semiconductor laser device. Such a structure efficiently cools the semiconductor laser device about the light emission spot.

The present invention will be understood more fully with reference to the following detailed explanation and accompanying drawings. The accompanying drawings are for illustration only and do not intend to limit the scope of the invention.

BRIEF DESCRIPTION OF THE DRAWINGS

FIG. 5 is a perspective view of a laser diode array;

EXPLANATIONS OF NUMERALS

10 . . . bottom plate; 12a to 12c . . . laser diode array; 14 . . . copper plate; 16 . . . lead electrode; 17a to 17d . . . insulation spacer; 18a to 18c . . . heatsink; 19 . . . suction port; 20 . . . upper plate; 22 . . . back plate; 24 . . . window plate; 25, 95 . . . jet port; 26 . . . feed pipe; 28 . . . discharge pipe; 30 . . . pump; 54 . . . inflow port; 56 . . . coolant; 60, 67a to 67c, 68a to 68c . . . flow path; 69 . . . common flow path; 80 . . . duct; 82 . . . FAC lens; 84 . . . joint pipe; 88 . . . inflow port; 100, 200 . . . laser apparatus

BEST MODES FOR CARRYING OUT THE INVENTION

In the following, embodiments of the present invention will be explained in detail with reference to the accompanying drawings. In the explanation of the drawings, the same constituents will be referred to with the same numerals without repeating their overlapping descriptions.

First Embodiment

Figure 1:
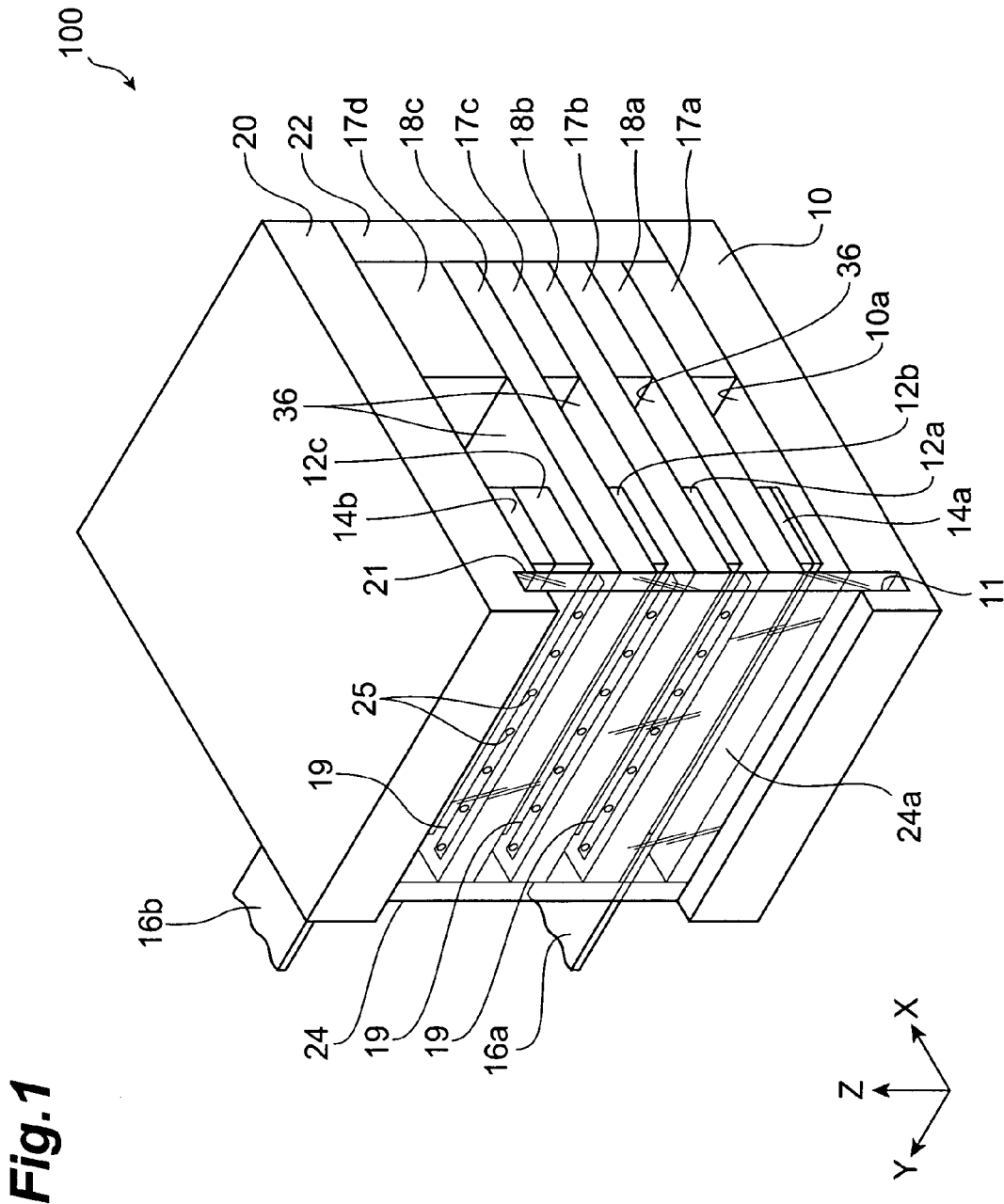
FIG. 1 is a perspective view of a laser apparatus as seen diagonally from the front side thereof.
Figure 2:
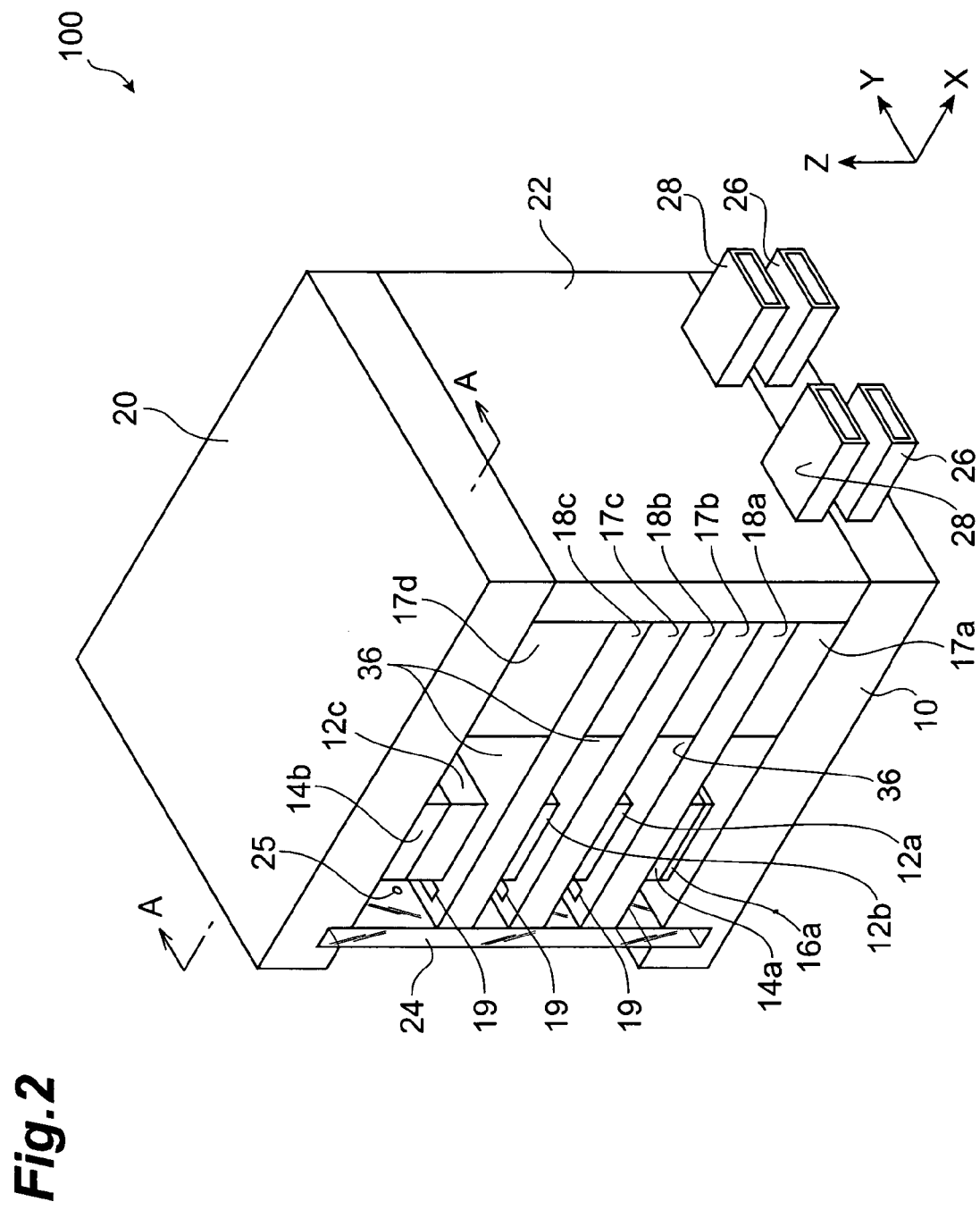
FIG. 2 is a perspective view of the laser apparatus as seen diagonally from the rear side thereof.
Figure 3:
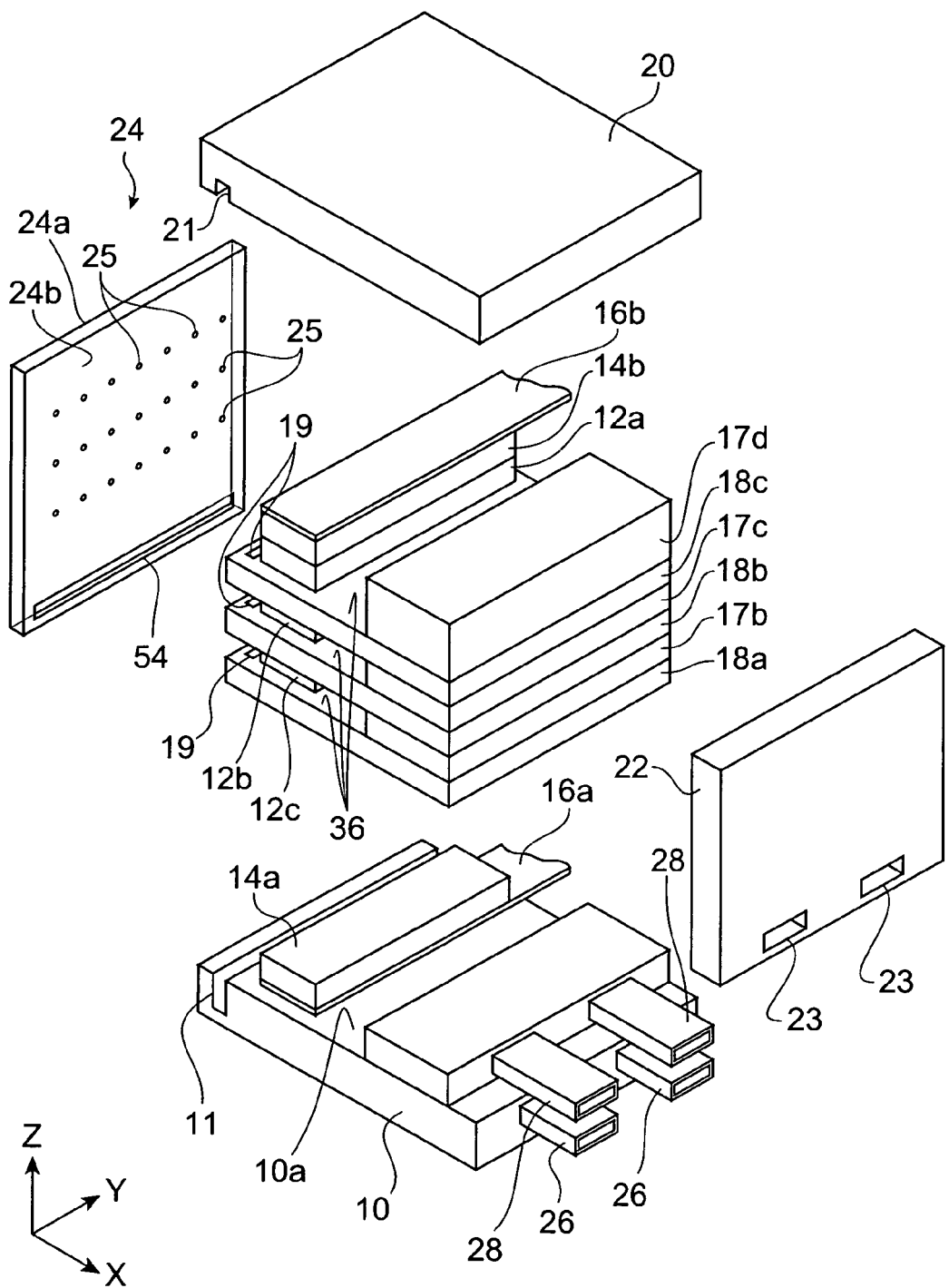
FIG. 3 is an exploded perspective view of the laser apparatus.
Figure 4:
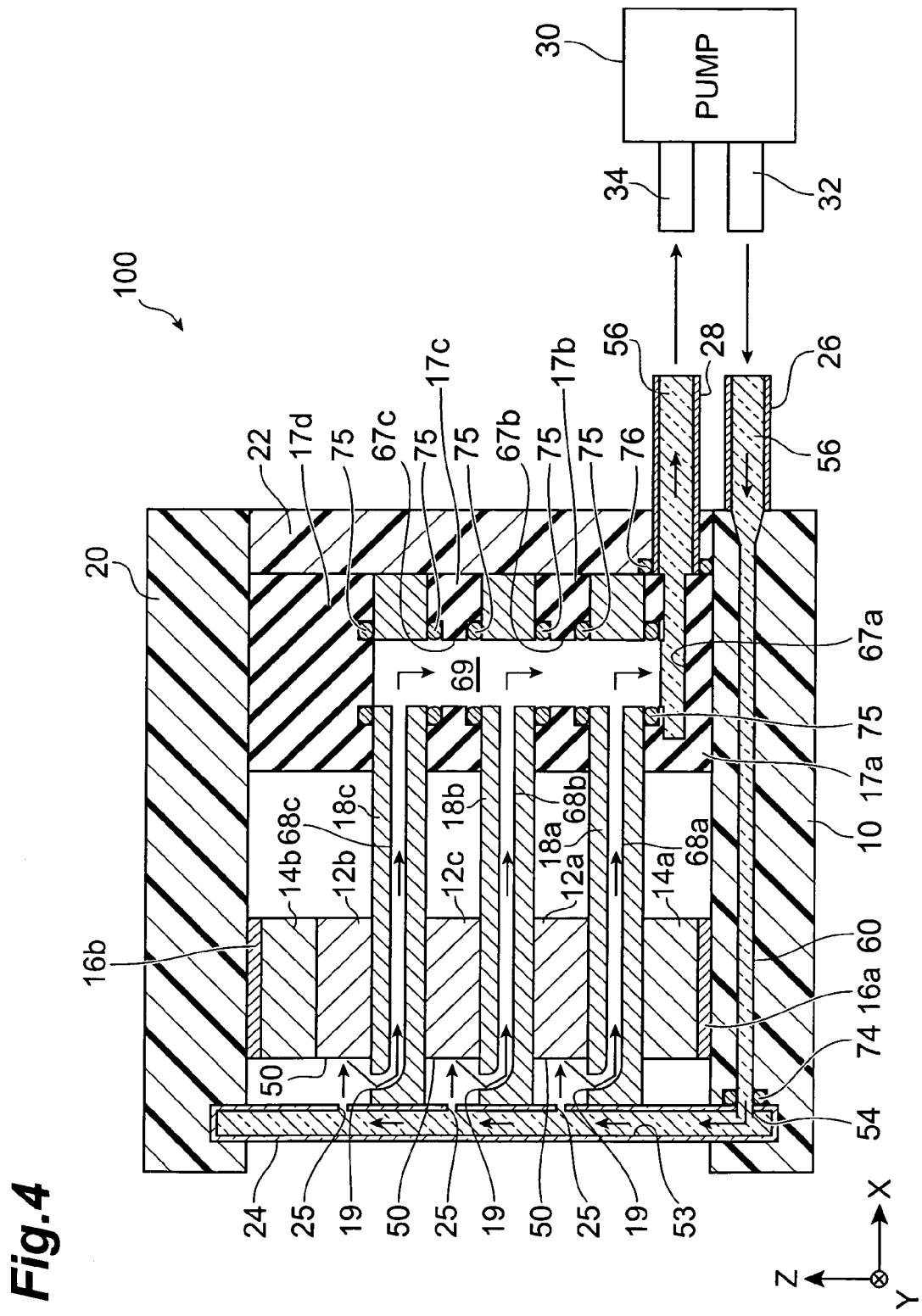
FIG. 4 is a sectional view taken along the line A-A of FIG. 2.

With reference to FIGS. 1 to 4, a first embodiment of the present invention will be explained. FIG. 1 is a perspective view of a laser apparatus 100 in accordance with this embodiment as seen diagonally from the front side thereof, whereas FIG. 2 is a perspective view of the laser apparatus 100 as seen diagonally from the rear side thereof. FIG. 3 is an exploded perspective view of the laser apparatus 100, whereas FIG. 4 is a sectional view taken along the line A-A of FIG. 2. These drawings also show X-, Y-, and Z-axes which are perpendicular to each other.

The laser apparatus 100 has three laser diode arrays 12a to 12c, two copper plates 14a and 14b, two lead electrodes 16a and 16b, four insulation spacers 17a to 17d, and three heatsinks 18a to 18c which are placed on a bottom plate 10. The lead electrode 16b and insulation spacer 17d are covered with an upper plate 20. An electrically insulating back plate 22 is attached to the back faces of the insulation spacers 17a to 17d and heatsinks 18a to 18c. A window plate 24 is attached to the front faces of the heatsinks 18a to 18c.

FIG. 5 is a perspective view showing the laser diode arrays. The laser diode arrays 12a to 12c have the same structure. Each laser diode array is a semiconductor laser device having a light output surface (front end face) 50. On the light output surface 50, there are a plurality of light emission spots 52 arranged along the Y direction at intervals of several 100 µm. Each light emission spot 52 is formed like an ellipse of several µm×several 10 to 100 µm, for example. Electrodes (not depicted) are provided on the upper and lower faces of the laser diode array. When a voltage is applied to the laser diode array through these electrodes, each of the light emission spots 52 emits laser light. The laser diode arrays 12a to 12c are arranged such that alignment directions of their light emission spots 52 are substantially parallel to each other.

The laser diode arrays 12a to 12c are mounted on the upper faces (laser mount surfaces) 36 of the heatsinks 18a to 18c, respectively, and are secured thereto. The laser diode array 12a is held between the upper face 36 of the heatsink 18a and the bottom face of the heatsink 18b. Similarly, the laser diode array 12b is held between the upper face 36 of the heatsink 18b and the bottom face of the heatsink 18c. The laser diode array 12c is held between the upper face 36 of the heatsink 18c and the copper plate 14b. The laser diode arrays 12a to 12c are arranged such that their light output surfaces 50 oppose the window plate 24. The light output surfaces 50 of the laser diode arrays 12a to 12c are arranged on the rear side with some distance from the leading ends of the heatsinks 18a to 18c.

The heatsinks 18a to 18c are electrically conductive flat plates having the same structure. These heatsinks are in contact with the electrodes of the laser diode arrays 12a to 12c, thereby electrically connecting the laser diode arrays 12a to 12c in series. Preferred as materials for the heatsinks 18a to 18c are conductors having high thermal conductivity, e.g., Cu and CuW.

As shown in FIG. 4, flow paths 68a to 68c for a coolant 56 employed for cooling the laser diode arrays are provided within the heatsinks 18a to 18c. The flow paths 68a to 68c extend under the laser diode arrays 12a to 12c to the rear side. The rear end parts of the flow paths 68a to 68c penetrate through their respective heatsinks along the vertical direction (Z direction). In the upper faces 36 of the heatsinks 18a to 18c, suction ports 19 communicating with the flow paths 68a to 68c are provided in front of the light output surfaces 50 of the laser diode arrays 12a to 12c. For preventing the heatsinks 18a to 18c from corroding, it will be preferred if the coolant 56 has high electric resistance. The coolant 56 may be either liquid or gas. Preferred examples of the coolant 56 include fluorocarbons (e.g., Fluorinert) and ion-exchanged water.

Each of the heatsinks 18a to 18c having the flow paths 68a to 68c therewithin can be made by using two electrically conductive sheets each having a thickness of about 400 µm with a groove of about 200 µm, for example. Butting these electrically conductive sheets against each other such that their grooves are overlaid on each other and joining them by techniques such as diffusion bonding, brazing, or adhesion can yield the heatsinks 18a to 18c.

The lead electrodes 16a and 16b are used for applying a driving voltage to the semiconductor laser arrays 12a to 12c. The copper plates 14a and 14b are electrically conductive spacers which electrically connect the laser diode arrays 12a to 12c to the lead electrodes 16a and 16b. The bottom face of the laser diode array 12a is electrically connected to the lead electrode 16a through the heatsink 18a and copper plate 14a. The upper face of the laser diode array 12c is electrically connected to the lead electrode 16b through the copper plate 14b. Thus, the laser diode arrays 12a to 12c are connected in series between the lead electrodes 16a and 16b. Therefore, when a voltage is applied between the lead electrodes 16a and 16b, laser light is emitted from the light emission spots 52 of the laser diode arrays 12a to 12c.

The lead electrode 16a is mounted on the upper face of the bottom plate 10 and is secured thereto. The bottom plate 10 is an electric insulator having a substantially parallel plate form, whereas a rectangular groove 11 is formed in its upper face 10a near the leading end thereof. On the upper face 10a, the lead electrode 16a and copper plate 14a are stacked in the rear of the groove 11, whereas the insulation spacer 17a is placed behind them. The upper face of the insulation spacer 17a is on the same level with the upper face of the copper plate 14a, whereas the heatsink 18a is secured onto these upper faces.

On the upper face 36 of the heatsink 18a, the insulation spacer 17b is placed in the rear of the laser diode array 12a. The upper face of the insulation spacer 17b is on the same level with the upper face of the laser diode array 12a, whereas the heatsink 18b is secured onto these upper faces. On the upper face 36 of the heatsink 18b, the insulation spacer 17c is placed in the rear of the laser diode array 12b. The upper face of the insulation spacer 17c is on the same level with the upper face of the laser diode array 12b, whereas the heatsink 18c is secured onto these upper faces. On the upper face 36 of the heatsink 18c, the insulation spacer 17d is placed in the rear of the laser diode array 12c. The upper face of the insulation spacer 17d is on the same level with the upper face of the lead electrode 16b, whereas the upper plate 20 is secured onto these upper faces. The insulation spacers 17a to 17d are flat plates made of elastic insulating materials such as rubber, for example, and are separated from the laser diode arrays 12a to 12c, copper plates 14a, 14b, and lead electrodes 16a, 16b.

The upper plate 20 is an electric insulator having a substantially parallel plate form, whereas a rectangular groove 21 is formed in its bottom face near the leading end thereof. Upper and lower end parts of the window plate 24 are inserted in the groove 21 of the upper plate 20 and the groove 11 of the bottom plate 10, respectively. The window plate 24 is a transparent parallel plate having two main faces, i.e., a front face 24a and a back face 24b. The laser light generated by the laser diode arrays 12a to 12c is emitted through the window plate 24. The window plate 24 is hollow, whereas its hollow part 53 is employed as a coolant chamber for accommodating the coolant 56 for cooling the laser diode arrays 12a to 12c.

Figure 6:
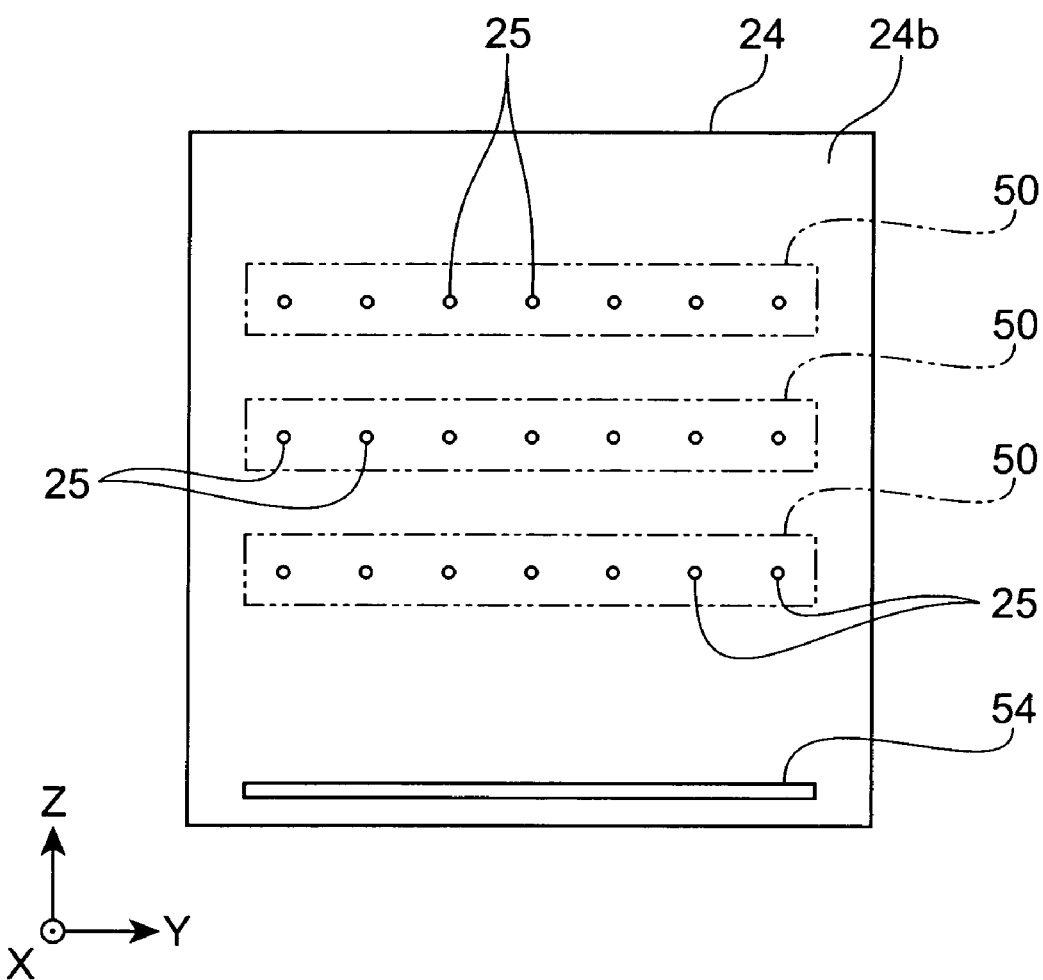
FIG. 6 is a plan view showing the back face of a window plate.

FIG. 6 is a plan view showing the back face 24b of the window plate 24. FIG. 6 also shows the light output surfaces 50 of the laser diode arrays 12a to 12c by dash-double-dot lines. The lower end part of the back face 24b is provided with a slit-like inflow port 54 communicating with the hollow part 53. The inflow port 54 is an opening for introducing the coolant 56 into the hollow part 53. The back face 24b is also provided with a plurality of jet ports 25 communicating with the hollow part 53. The jet ports 25 are openings for jetting the coolant 56 from within the hollow part 53 and have such a small opening area as to be able to jet the coolant 56. These jet ports 25 are arranged along the Y direction in three rows so as to oppose their corresponding light output surfaces 50 of the laser diode arrays 12a to 12c. In this embodiment, the jet ports 25 correspond to the light emission spots 52 one by one and are arranged so as to jet the coolant 56 near their corresponding light emission spots 52.

The window plate 24 is constructed by a material which transmits therethrough the laser light emitted from the laser diode arrays 12a to 12c. Therefore, the coolant can be jetted onto the light output surfaces 50 without obstructing the emission of laser light. When jetting the coolant 56 from the jet ports 25, the hollow part 53 of the window plate 24 is filled with the coolant 56, which correspondingly applies a pressure to the window plate 24, whereby sufficient mechanical strength is also required for the material of the window plate 24. An example of materials satisfying these conditions is silica.

As shown in FIG. 4, a flow path 60 for the coolant 56 is provided within the bottom plate 10. The back face of the bottom plate 10 is provided with feed pipes 26 projecting rearward. Each feed pipe 26 is a coolant inflow port used for introducing the coolant 56 into the laser apparatus 100. One end of the feed pipe 26 communicates with the flow path 60, whereas the other end is connected to an exit port 32 of a pump 30 by a tube which is not depicted. The pump 30 discharges the coolant 56, which is pressurized to a fluid pressure of about 0.19 to 0.4 MPa, for example, from the exit port 32 to the flow path 60 through the tube and feed pipes 26.

Flow paths 67a to 67c are also provided within the insulation spacers 17a to 17c. The rear end parts of the flow paths 68a to 68c within the heatsinks are connected to these flow paths 67a to 67c. The heatsinks 18a to 18c and the insulation spacers 17a to 17d are sealed with O-rings 75. As shown in FIG. 4, the rear end parts of the flow paths 68a to 68c and the flow paths 67a to 67c form a common flow path 69 extending in the Z direction.

Discharge pipes 28 extend rearward from the back face of the insulation spacer 17a. Each discharge pipe 28 is a coolant exit port used for discharging the coolant 56 from the laser apparatus 100. The back plate 22 and the discharge pipes 28 are sealed with O-rings 76. The discharge pipes 28 project rearward through openings 23 provided in the back plate 22, and are connected to a suction port 34 of the pump 30 by a tube which is not depicted. The pump 30 takes in the coolant 56 from the flow path 67a within the insulation spacer 17a through the discharge pipes 28, tube, and suction port 34.

Thus, the pump 30 is connected between the flow paths 68a to 68c within the heatsinks 18a to 18c and the flow path 60 within the bottom plate 10, takes in the coolant 56 from the flow paths 68a to 68c, and discharges the coolant 56 to the flow path 60. The feed pipes 26 are arranged on the upstream side of the flow path 60, whereas the discharge pipes 28 are arranged on the downstream side of the flow paths 68a to 68c. The hollow part 53 of the window plate 24 functions as a flow path arranged between the flow path 60 and the flow paths 68a to 68c.

The flow path 60 within the bottom plate 10 communicates with the hollow part 53 of the window plate 24 through the inflow port 54 provided in the back face 24b of the window plate 24. Therefore, the coolant 56 discharged to the flow path 60 from the pump 30 is introduced into the hollow part 53 through the inflow port 54. The window plate 24 and the bottom plate 10 are sealed with an O-ring 74. When the hollow part 53 is sufficiently filled with the coolant 56, the latter is jetted from the jet ports 25 and collides with the light output surfaces 50 of the laser diode arrays 12a to 12c. Thus, the light output surfaces 50 are cooled by jet flows of the coolant 56.

Thereafter, the coolant 56 flows into the flow paths 68a to 68c through the suction ports 19 of the heatsinks 18a to 18c. The coolant 56 is inhaled by the pump 30, so as to flow through the flow paths 68a to 68c toward the common flow path 69. As a result, heat is absorbed from the bottom face of the laser diode arrays 12a to 12c, whereby these laser diode arrays are further cooled. The coolant 56 flows into the flow path 67a within the insulation spacer 17a from the flow paths 68a to 68c through the common flow path 69. The pump 30 takes in the coolant 56 through the discharge pipes 28 and intake port 34, and discharges the taken-in coolant 56 again to the feed pipes 26 from the exit port 32. Thus, the coolant 56 is circulated between the laser apparatus 100 and the pump 30.

In such a manner, the laser apparatus 100 causes jet flows of the coolant 56 to impinge on the light output surfaces 50 of the laser diode arrays 12a to 12c and thus can efficiently cool the light output surfaces 50. In particular, since a plurality of jet ports 25 align along the alignment direction of the light emission spots 52 and are arranged such as to jet the coolant 56 near their corresponding light emission spots 52, the surroundings of the light emission spots 52, which are apt to generate high heat, can be cooled efficiently. Therefore, while high light output can be obtained, the temporal deterioration of light output can be suppressed, so as to enhance the long-term reliability of the laser apparatus 100.

Second Embodiment

Figure 7:
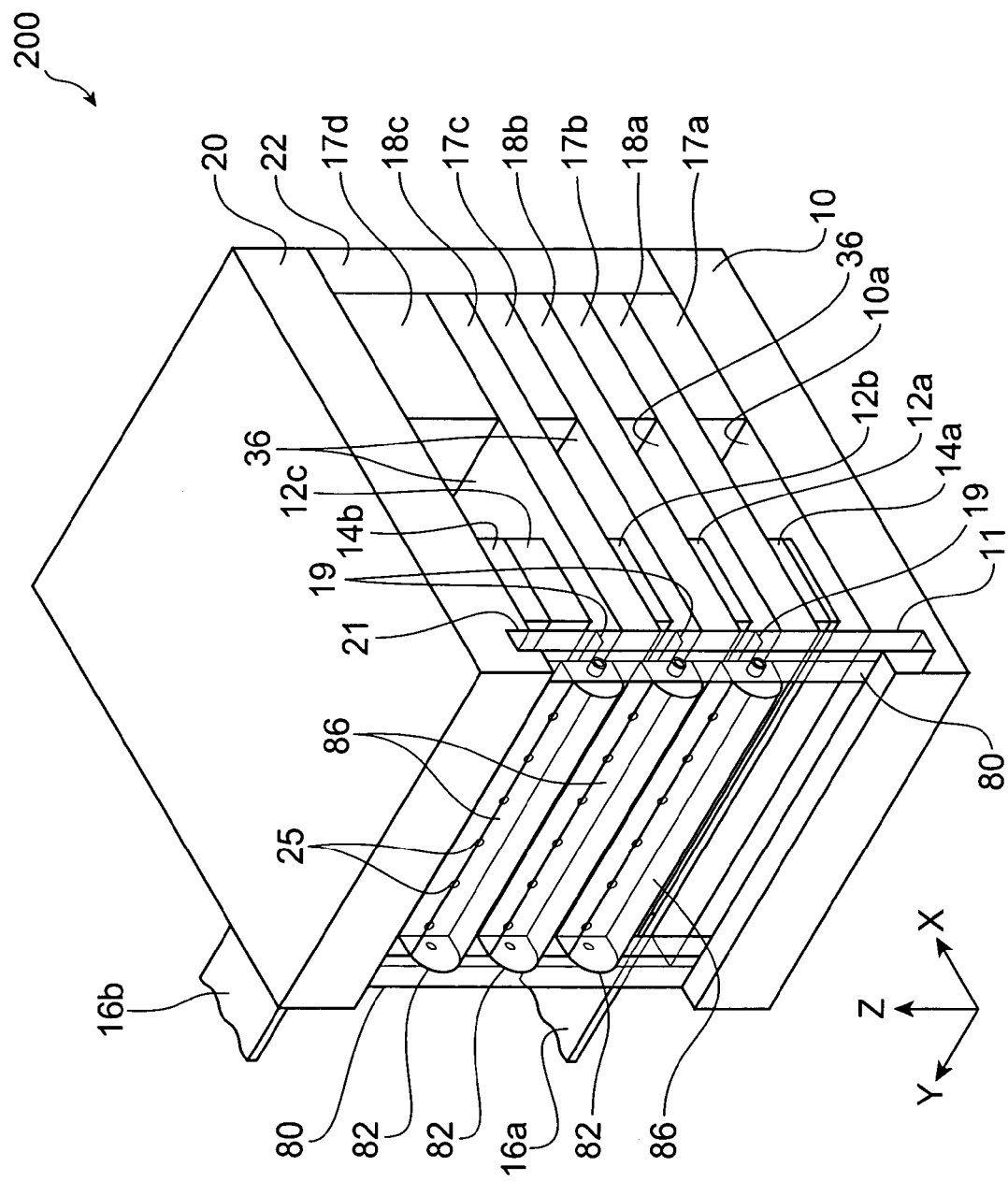
FIG. 7 is a perspective view of a laser apparatus as seen diagonally from the front side thereof.
Figure 8:
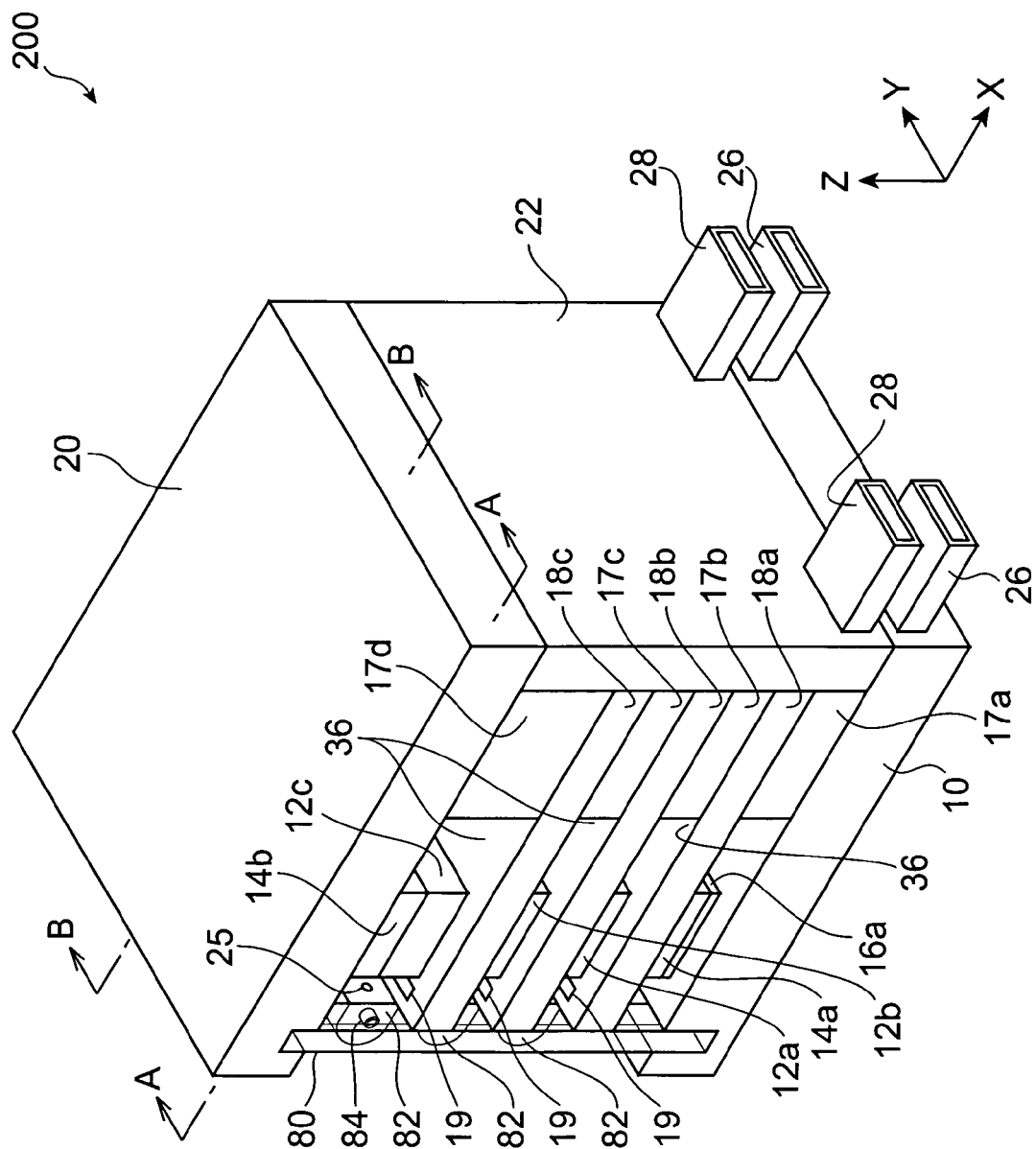
FIG. 8 is a perspective view of the laser apparatus as seen diagonally from the rear side thereof.
Figure 9:
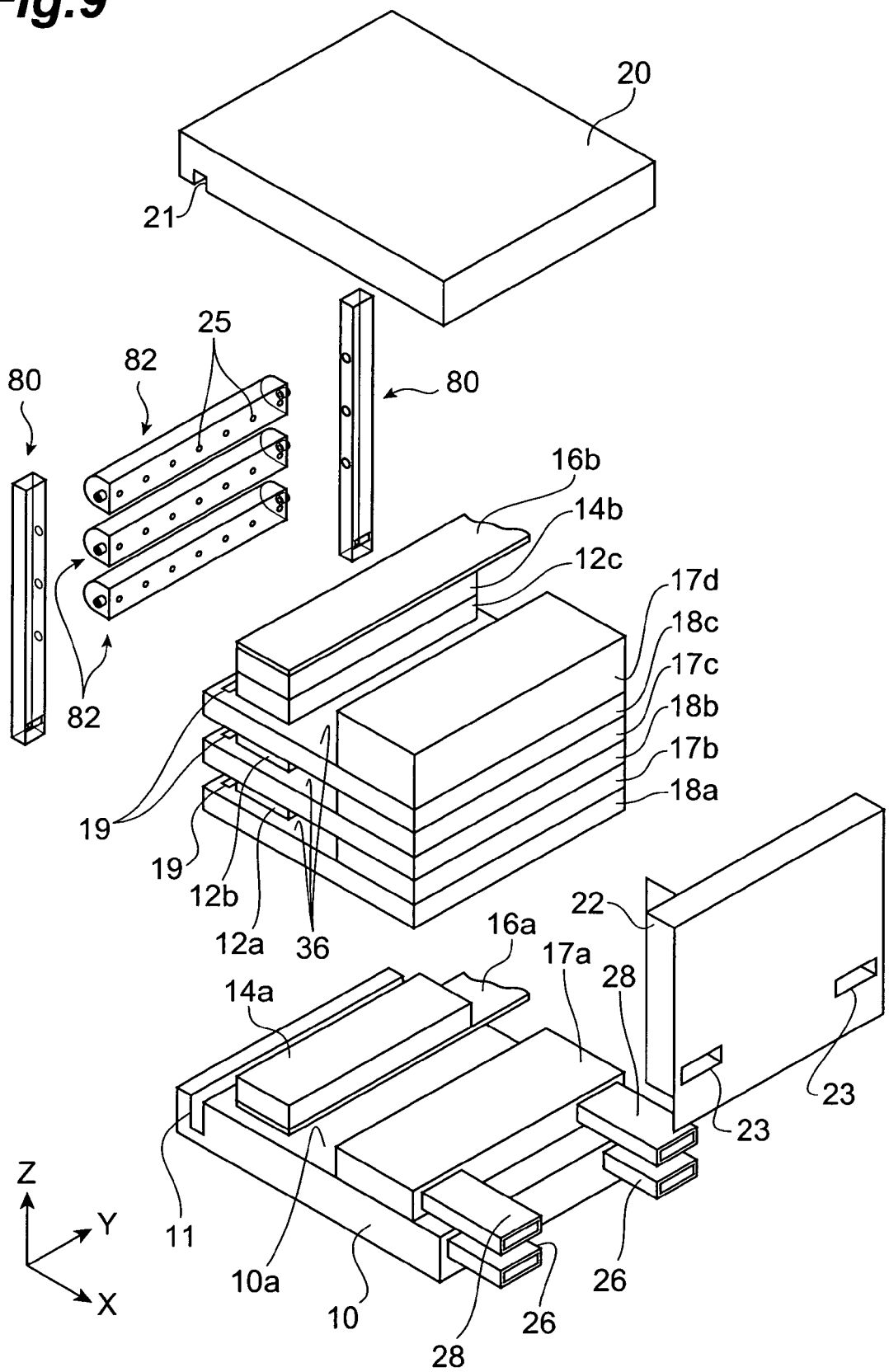
FIG. 9 is an exploded perspective view of the laser apparatus.
Figure 10:
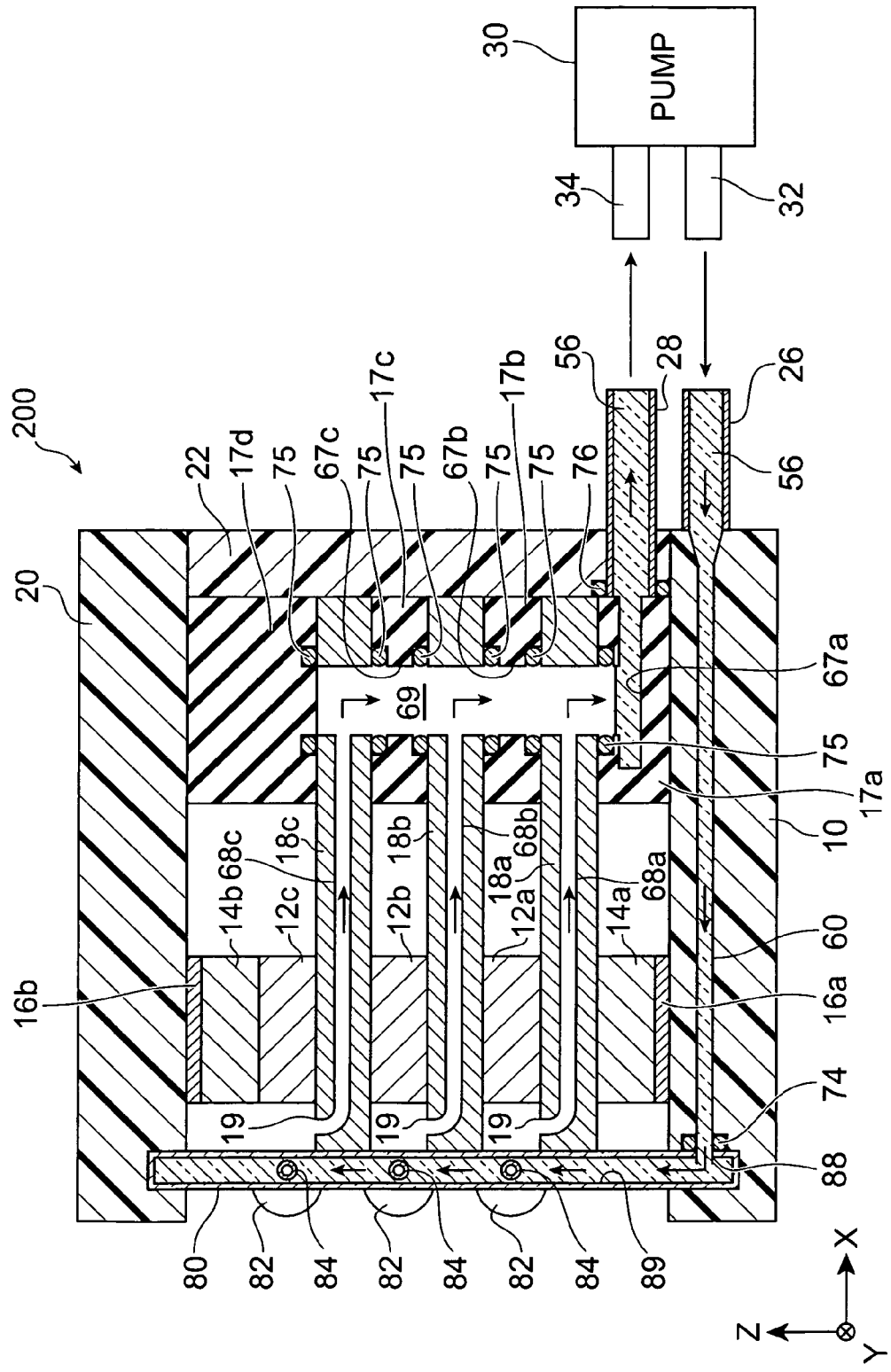
FIG. 10 is a sectional view taken along the line A-A of FIG. 8.
Figure 11:
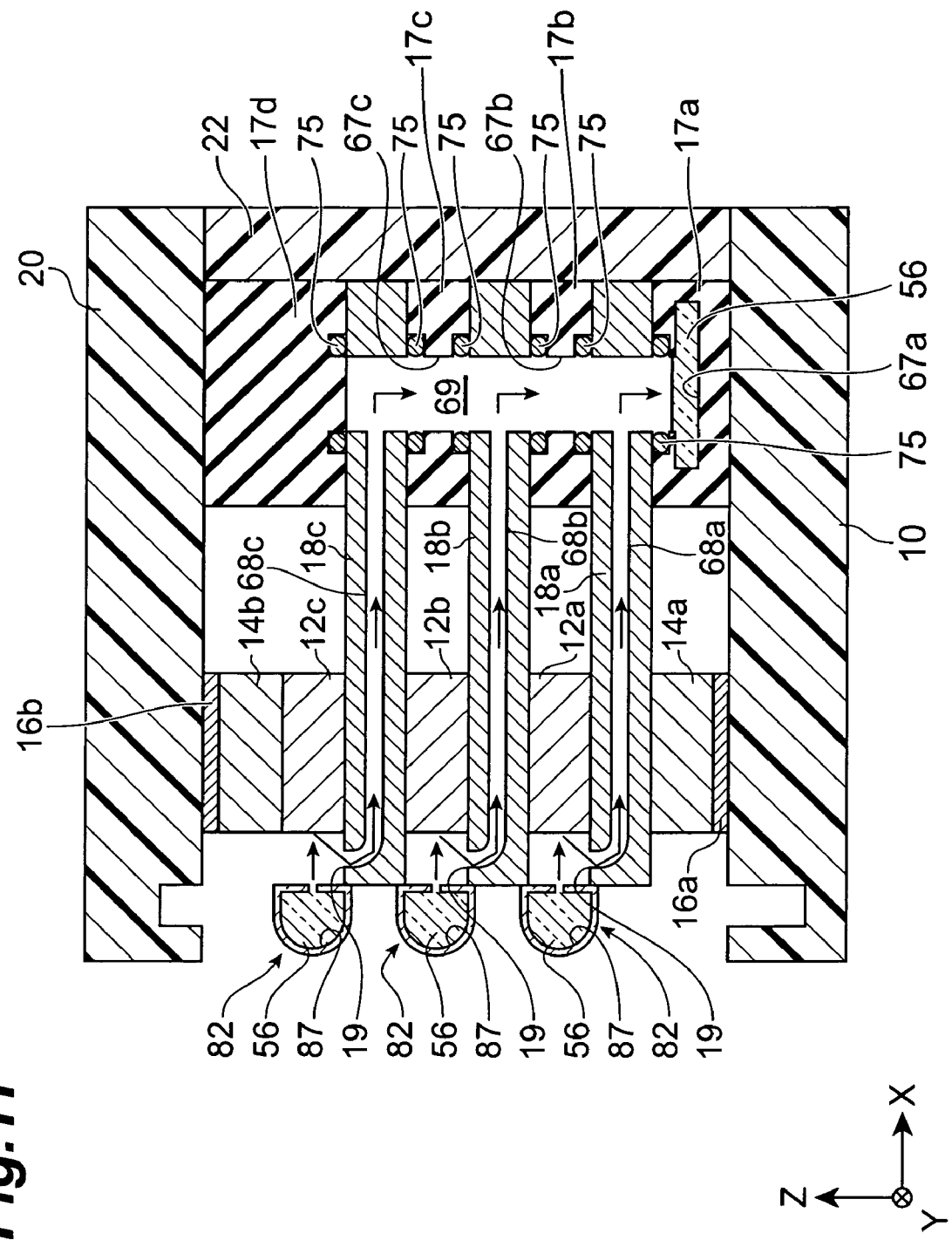
FIG. 11 is a sectional view taken along the line B-B of FIG. 8.

In the following, a second embodiment of the present invention will be explained with reference to FIGS. 7 to 11. FIG. 7 is a perspective view of a laser apparatus 200 in accordance with this embodiment as seen diagonally from the front side thereof, whereas FIG. 8 is a perspective view of the laser apparatus 200 as seen diagonally from the rear side thereof. FIG. 9 is an exploded perspective view of the laser apparatus 200, FIG. 10 is a sectional view taken along the line A-A of FIG. 8, and FIG. 11 is a sectional view taken along the line B-B of FIG. 8. These drawings also show X-, Y-, and Z-axes which are perpendicular to each other.

The laser apparatus 200 differs from the laser apparatus 100 of the first embodiment in that it comprises two ducts 80 and three FAC (Fast Axis Collimator) lenses 82 in place of the window plate 24. The following explanation will focus on the differences from the first embodiment.

Figure 12:
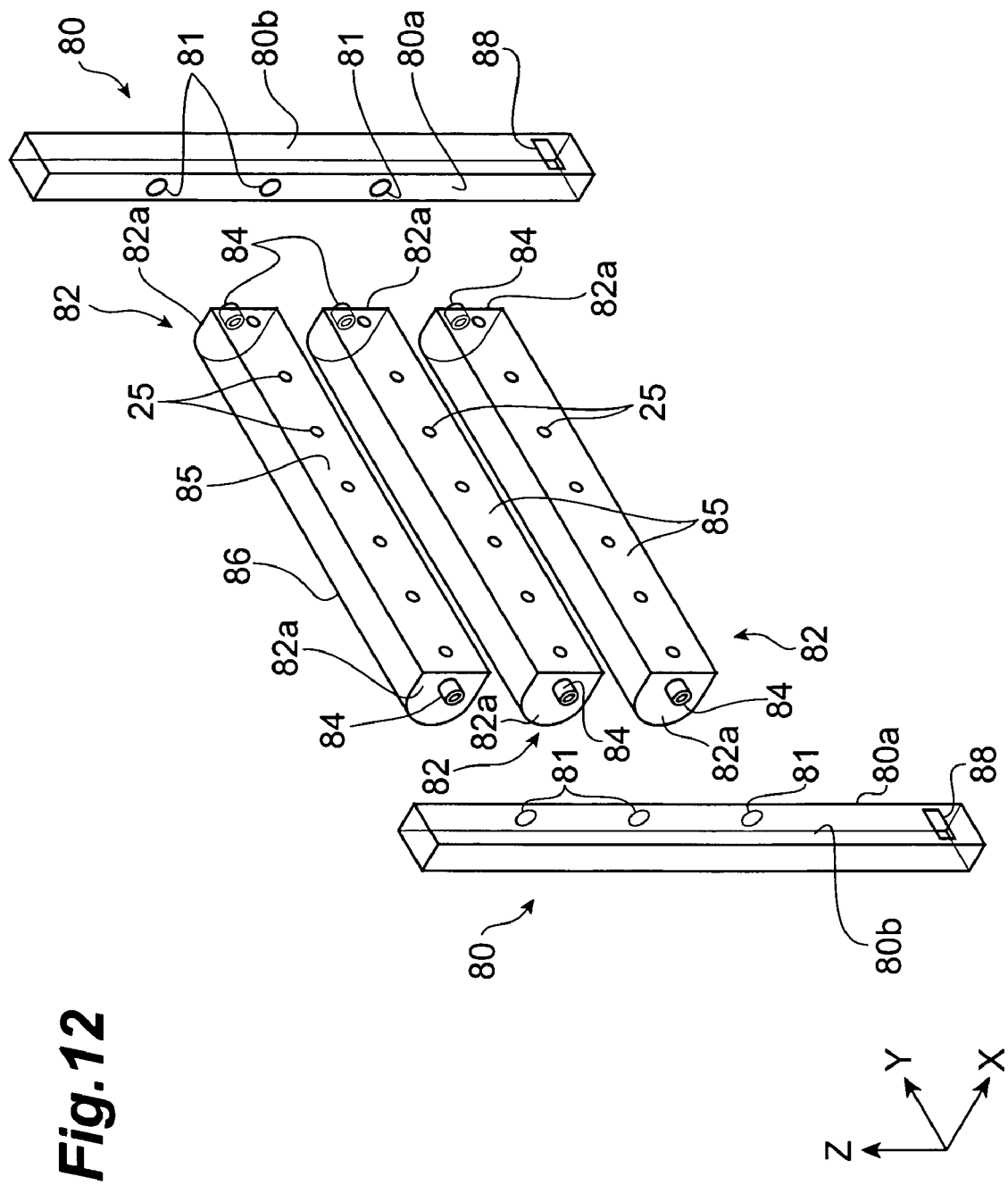
FIG. 12 is an exploded perspective view showing ducts and FAC lenses under magnification.

FIG. 12 is an exploded perspective view showing the ducts 80 and FAC lenses 82 under magnification. Each of the ducts 80 is a transparent hollow rectangular parallelepiped elongated in the Z direction. Upper and lower end parts of each duct 80 are inserted in the groove 21 of the upper plate 20 and the groove 11 of the bottom plate 10, respectively. The duct 80 has a side face 80a which abuts against end faces 82a of the FAC lenses 82 and is formed with the same number of openings 81 as that of the FAC lenses 82. These openings 81 communicate with the inside 89 (see FIG. 10) of the duct 80. The inside 89 of the duct 80 is used as a coolant chamber for accommodating the coolant 56. An inflow port 88 communicating with the inside 89 of the duct 80 is provided at a lower end part of the back face 80b of the duct 80.

Each of the FAC lenses 82 is a collimator lens which collimates the laser light emitted from the laser diode arrays 12a to 12c in the fast axis direction of the laser diode arrays 12a to 12c. In other words, the FAC lens 82 collimates the laser light within a plane perpendicular to the slow axis direction of the laser diode arrays 12a to 12c. In this embodiment, the fast and slow axis directions equal the Z and Y directions, respectively. The FAC lens 82 is a cylindrical lens extending in the Y direction, and has a first lens surface 85 opposing the light output surfaces 50 of the laser diode arrays 12a to 12c and a second lens surface 86 arranged farther from the light output surfaces 50 than is the first lens surface 85. The first lens surface 85 is a flat surface perpendicular to the X direction. The second lens surface 86 is a cylindrical surface having a generatrix parallel to the alignment direction of the light emission spots 52 of the laser diode arrays 12a to 12c, i.e., Y direction. Though the FAC lenses 82 are transparent, objects existing behind the FAC lenses 82 are not shown in FIG. 7 for simplifying the drawing.

The FAC lenses 82 are held between the two ducts 80. Two end faces 82a of each FAC lens 82 abut against the side faces 80a of the two ducts 80, respectively. Joint pipes 84 project from the respective end faces 82a. The FAC lens 82 is hollow, whereas the joint pipes 84 communicate with its hollow part 87. The joint pipes 84 are inserted into their corresponding openings 81 of the ducts 80, whereby the inside 89 of the ducts 80 and the hollow part 87 of the FAC lens 82 communicate with each other. The hollow part 87 is used as a coolant chamber for accommodating the coolant 56. The ducts 80 and the FAC lenses 82 are sealed with a sealing member (e.g., O-ring) which is not depicted.

Figure 13:
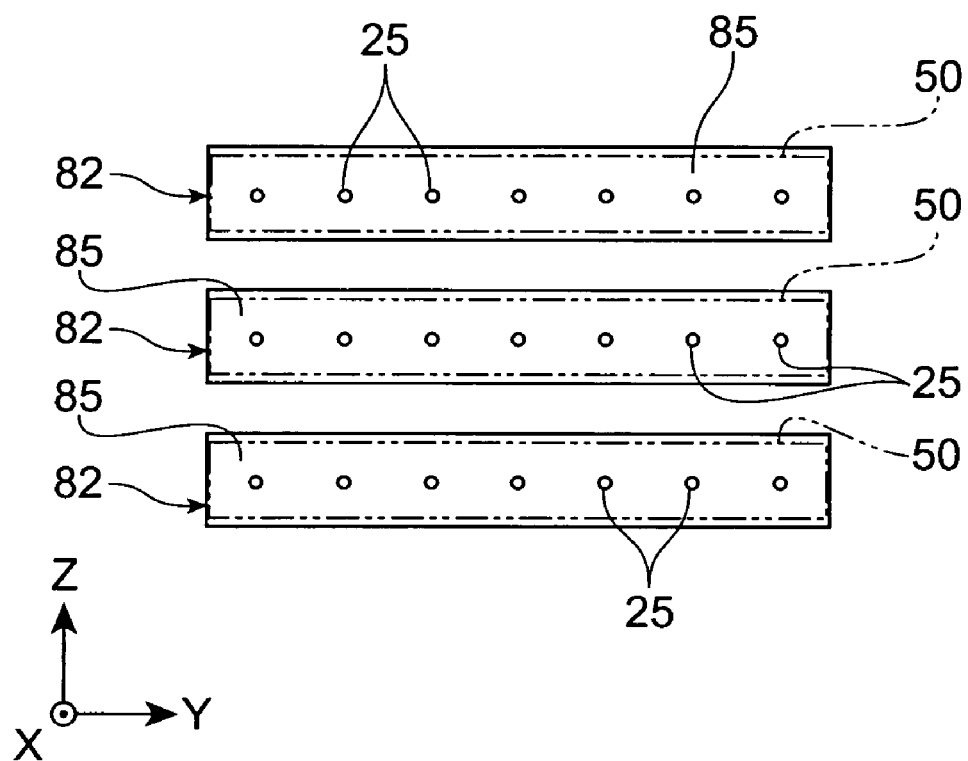
FIG. 13 is a plan view showing the back faces of the FAC lenses.

FIG. 13 is a plan view showing the first lens surfaces 85 of the FAC lenses 82. FIG. 13 also shows the light output surfaces 50 of the laser diode arrays 12a to 12c by dash-double-dot lines. The first lens surface 85 of each FAC lens 82 is provided with a plurality of jet ports 25 communicating with the hollow part 87 of the FAC lens 82. The jet ports 25 are openings for jetting the coolant 56 from within the hollow part 53 of the FAC lens 82 and have such a small opening area as to be able to jet the coolant 56. These jet ports 25 are arranged along the Y direction in three rows so as to oppose their corresponding light output surfaces 50 of the laser diode arrays 12a to 12c. In this embodiment, the jet ports 25 correspond to the light emission spots 52 one by one, and are arranged so as to jet the coolant 56 near their corresponding light emission spots 52. For the same reason as with the window plate 24, the FAC lens 82 is constructed by a material (e.g., silica) which transmits therethrough the laser light emitted from the laser diode arrays 12a to 12c while having sufficient mechanical strength.

As shown in FIG. 10, the flow path 60 within the bottom plate 10 communicates with the inside 89 of each duct 80 through its inflow port 88. The duct 80 and the bottom plate 10 are sealed with an O-ring 74. When the pump 30 feeds the flow path 60 with the coolant 56, the latter is introduced to the inside 89 of the duct 80. When the inside 89 of the duct 80 is sufficiently filled with the coolant 56, the latter flows into the hollow part 87 of the FAC lens 82 through the joint pipe 84. When the hollow part 87 is sufficiently filled with the coolant 56, the latter is jetted from the jet ports 25 and collides with the light output surfaces 50 of the laser diode arrays 12a to 12c. Thus, the light output surfaces 50 are cooled by jet flows of the coolant 56.

Thereafter, the coolant 56 flows into the flow paths 68a to 68c through the suction ports 19 of the heatsinks 18a to 18c. The coolant 56 is inhaled by the pump 30, so as to flow through the flow paths 68a to 68c toward the common flow path 69. As a result, heat is absorbed from the bottom faces of the laser diode arrays 12a to 12c, whereby these laser diode arrays are further cooled. The pump 30 takes in the coolant 56 through the discharge pipes 28 and intake port 34, and discharges the taken-in coolant 56 again to the feed pipes 26 from the exit port 32. Thus, the coolant 56 is circulated between the laser apparatus 200 and the pump 30. The inside 89 of the duct 80 and the hollow part 87 of the FAC lens 82 function as a flow path arranged between the flow path 60 and the flow paths 68a to 68c.

As in the first embodiment, the laser apparatus 200 causes jet flows of the coolant 56 to impinge on the light output surfaces 50 of the laser diode arrays 12a to 12c and thus can efficiently cool the light output surfaces 50. As a result, while high light output can be obtained, the temporal deterioration of light output can be suppressed, so as to enhance the long-term reliability of the laser apparatus 200. Further, the FAC lenses 82 are secured within the laser apparatus 200 in this embodiment. Therefore, using the laser apparatus 200 is convenient in that it is unnecessary to prepare an FAC lens separately from the laser apparatus and aligning the FAC lens with the laser apparatus.

Though explained in detail according to its embodiments in the foregoing, the present invention is not limited to the above-mentioned embodiments. The present invention can be modified in various ways within the scope not deviating from the gist thereof.

In the above-mentioned embodiments, the pump 30 feeds the coolant 56 into the flow path 60 within the bottom plate 10, whereas the coolant jetting means (window plate 24 or FAC lens 82) is filled with the coolant 56 through the flow path 60. However, the coolant may be fed to the coolant jetting means from the pump 30 without traveling the bottom plate 10. For example, the exit port 32 of the pump 30 may be connected to the inflow port of the coolant jetting means through a tube or the like.

The second embodiment feeds the hollow part 87 of the FAC lens 82 with the coolant 56 by using the duct 80 that is hard. However, a soft tube may be used instead of the duct 80 so as to feed the hollow part 87 with the coolant 56.

Figure 14:
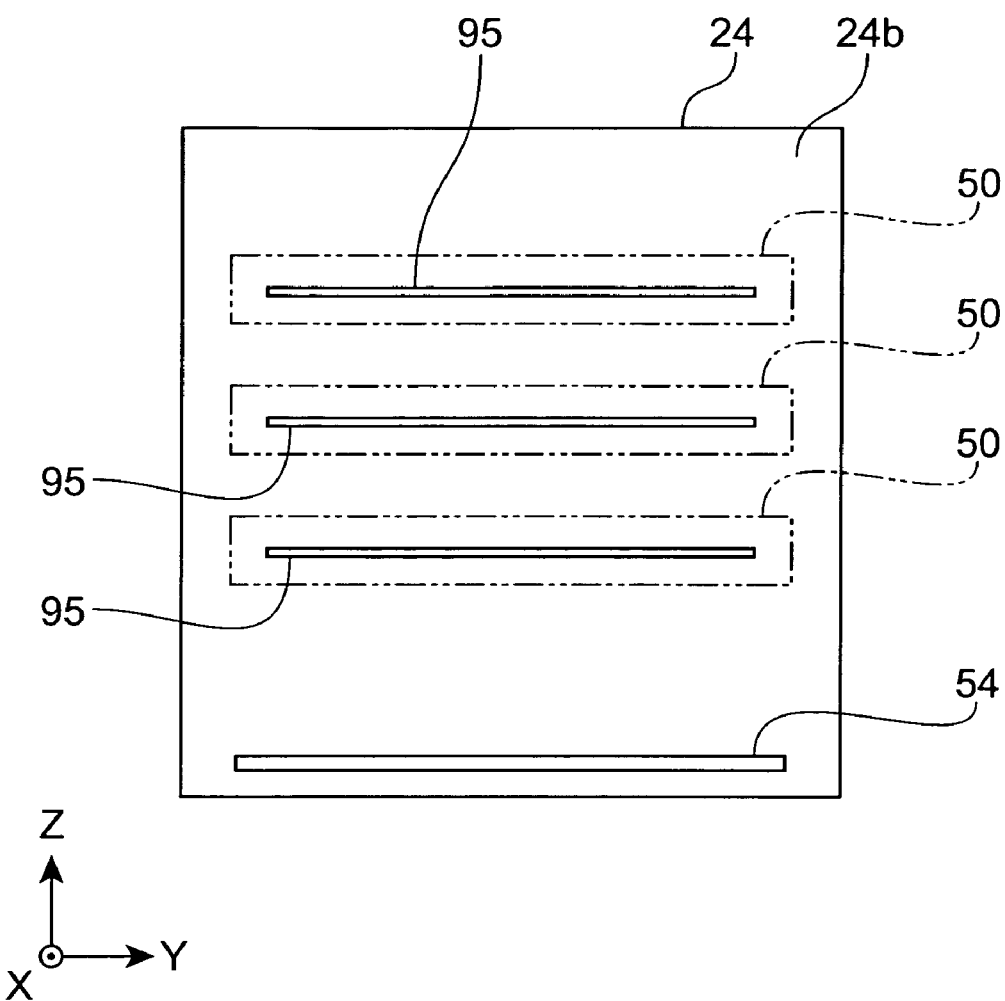
FIG. 14 is a plan view showing a modified example of the window plate.
Figure 15:
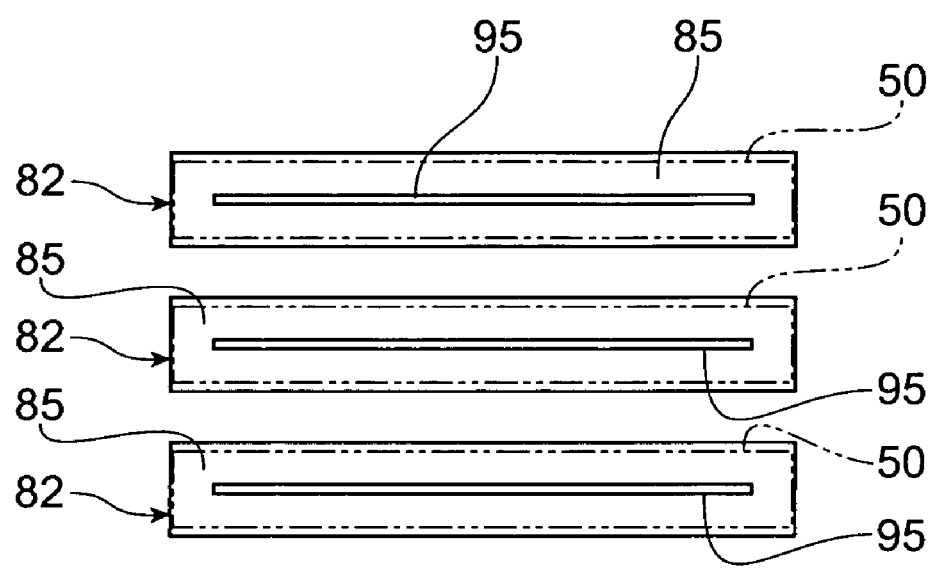
FIG. 15 is a plan view showing a modified example of the FAC lenses.

The two-dimensional form of the jet ports 25 is not limited to circles but may be any forms (e.g., rectangles) which can jet the coolant 56. Also, as shown in FIGS. 14 and 15, a slit-like jet port 95 may be used in place of a plurality of jet ports 25 arranged in a row. Here, FIGS. 14 and 15 are plan views showing the window plate 24 and a set of FAC lenses 82, respectively, each having the jet port 95 in place of the jet ports 25. The jet port 95 is a rectangular opening elongated in the alignment direction of the light emission spots 52 of the laser diode arrays, i.e., Y direction. The jet port 95 communicates with the hollow part of the window plate 24 or FAC lens 82 and has such a narrow width as to be able to jet the coolant 56. Using the jet port 95 having such a form can also efficiently cool the surroundings of the light emission spots 52.

In the first embodiment, the suction ports 19 of the heatsinks 18a to 18c are formed between the leading ends of the heatsinks 18a to 18c and the positions where the laser diode arrays 12a to 12c are mounted. For placing the window plate 24 and the laser diode arrays 12a to 12c close to each other, however, the suction ports 19 may be provided near the side faces of the laser diode arrays 12a to 12c, i.e., on both sides of the laser diode arrays, in the upper faces 36 of the heatsinks 18a to 18c.

From the invention thus described, it will be obvious that the same may be varied in many ways. Such variations are not to be regarded as a departure from the scope of the invention, and all such modifications as would be obvious to one skilled in the art are intended to be included within the scope of the following claims.

INDUSTRIAL APPLICABILITY

By jetting a coolant onto a light output surface of a semiconductor laser device, the laser apparatus of the present invention can efficiently cool the light output surface. As a result, it can suppress the temporal deterioration of light output in semiconductor laser devices and enhance longterm reliability.

The invention claimed is:

1. A laser apparatus comprising:
   a semiconductor laser device having a light output surface for emitting laser light;
   coolant jetting means having a coolant chamber for accommodating a coolant, and a jet port communicating with the coolant chamber and opposing the light output surface of the laser device; and
   a heatsink having a laser mount surface for mounting the semiconductor laser device and a first coolant flow path where the coolant jetted from the jet port flows in;
   the coolant jetting means being a plate having a main face opposing the light output surface, the plate transmitting the laser light therethrough;
   the plate having a hollow part as the coolant chamber; and
   the jet port being provided in the main face.

2. A laser apparatus according to claim 1, wherein the semiconductor laser device has a plurality of light emission spots arranged along one direction on the light output surface; and
   wherein the coolant jetting means has a plurality of jet ports aligned along the direction along which the light emission spots are arranged.

3. A laser apparatus according to claim 1, wherein the semiconductor laser device has a plurality of light emission spots arranged along one direction on the light output surface; and
   wherein the jet port is a slit elongated along the direction along which the light emission spots are arranged.

4. A laser apparatus according to claim 1, wherein the laser mount surface has a coolant suction port communicating with the first coolant flow path.

5. A laser apparatus according to claim 1, further comprising a coolant exit port communicating with the first coolant flow path.

6. A laser apparatus according to claim 1, further comprising:
   a support member, mounted with the semiconductor laser device and the heatsink, having a second coolant flow path; and
   a pump, connected between the first and second coolant flow paths, for taking in the coolant from the first coolant flow path and discharging the coolant to the second coolant flow path;
   wherein the coolant jetting means further has an inflow port communicating with the coolant chamber; and
   wherein the coolant jetting means is attached to the support member in a state where the inflow port communicates with the second coolant flow path.

7. A laser apparatus according to claim 1, wherein the semiconductor laser device has a light emission spot arranged on the light output surface; and
   wherein the jet port is arranged such as to jet the coolant near the light emission spot in the light output surface of the semiconductor laser device.

8. A laser apparatus comprising:
   a semiconductor laser device having a light output surface for emitting laser light;
   coolant jetting means having a coolant chamber for accommodating a coolant, and a jet port communicating with the coolant chamber and opposing the light output surface of the laser device; and
   a heatsink having a laser mount surface for mounting the semiconductor laser device and a first coolant flow path where the coolant jetted from the jet port flows in;
   the coolant jetting means being a collimator lens having a first lens surface opposing the light output surface and a second lens surface arranged further from the light output surface than is the first lens surface;
   the collimator lens having a hollow part as the coolant chamber; and
   the jet port being provided in the first lens surface.

9. A laser apparatus according to claim 8, wherein the semiconductor laser device has a plurality of light emission spots arranged along one direction on the light output surface; and
   wherein the coolant jetting means has a plurality of jet ports aligned along the direction along which the light emission spots are arranged.

10. A laser apparatus according to claim 8, wherein the semiconductor laser device has a plurality of light emission spots arranged along one direction on the light output surface; and
   wherein the jet port is a slit elongated along the direction along which the light emission spots are arranged.

11. A laser apparatus according to claim 8, wherein the laser mount surface has a coolant suction port communicating with the first coolant flow path.

12. A laser apparatus according to claim 8, further comprising a coolant exit port communicating with the first coolant flow path.

13. A laser apparatus according to claim 8, further comprising:
- a support member, mounted with the semiconductor laser device and the heatsink, having a second coolant flow path; and
- a pump, connected between the first and second coolant flow paths, for taking in the coolant from the first coolant flow path and discharging the coolant to the second coolant flow path;

wherein the coolant jetting means further has an inflow port communicating with the coolant chamber; and wherein the coolant jetting means is attached to the support member in a state where the inflow port communicates with the second coolant flow path.

14. A laser apparatus according to claim 8, wherein the semiconductor laser device has a light emission spot arranged on the light output surface; and wherein the jet port is arranged such as to jet the coolant near the light emission spot in the light output surface of the semiconductor laser device.

* * * * *